United States Patent
da Silva et al.

(10) Patent No.: US 8,624,571 B2
(45) Date of Patent: Jan. 7, 2014

(54) DC-DC CONVERTERS WITH PULSE GENERATORS SHARED BETWEEN PWM AND PFM MODES

(75) Inventors: José Barreiro da Silva, Woburn, MA (US); Rajul Ramesh Shah, Gilbert, AZ (US); Patrick Stanley Riehl, Cambridge, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 79 days.

(21) Appl. No.: 12/647,377

(22) Filed: Dec. 24, 2009

(65) Prior Publication Data
US 2011/0156684 A1 Jun. 30, 2011

(51) Int. Cl.
*G05F 1/00* (2006.01)
(52) U.S. Cl.
USPC .......................................................... 323/283
(58) Field of Classification Search
USPC .................. 323/271, 282–284, 234, 272, 285
See application file for complete search history.

(56) References Cited

U.S. PATENT DOCUMENTS

| | | | |
|---|---|---|---|
| 7,439,720 B2 | 10/2008 | Nguyen | |
| 2005/0057238 A1* | 3/2005 | Yoshida | 323/282 |
| 2006/0200300 A1* | 9/2006 | Bryan et al. | 701/112 |
| 2007/0257647 A1* | 11/2007 | Chen et al. | 323/282 |
| 2008/0022139 A1* | 1/2008 | Lin et al. | 713/320 |
| 2008/0061758 A1* | 3/2008 | Nishida | 323/284 |
| 2008/0169796 A1* | 7/2008 | Buethker et al. | 323/282 |
| 2009/0174379 A1 | 7/2009 | Lima | |
| 2009/0218998 A1 | 9/2009 | Huang | |
| 2009/0218999 A1 | 9/2009 | Kikuchi | |
| 2010/0225293 A1* | 9/2010 | Wang et al. | 323/290 |
| 2011/0012658 A1* | 1/2011 | Hsieh et al. | 327/172 |

FOREIGN PATENT DOCUMENTS

WO 2008020385 A2 2/2008

OTHER PUBLICATIONS

Xu Zhang and Dragan Maksimovic, "Digital PWM/PFM Controller with Input Voltage Feed-Forward for Synchronous Buck Converters", Colorado Power Electronics Center, ECE Department, University of Colorado, Boulder, CO 80309-0425, 2008 IEEE, p. 523-528.
"International Search Report" mailed on Aug. 23, 2011 for International application No. PCT/SG2010/000480, International filing date: Dec. 22, 2010.

* cited by examiner

*Primary Examiner* — Adolf Berhane
*Assistant Examiner* — Jeffrey Gblende
(74) *Attorney, Agent, or Firm* — Winston Hsu; Scott Margo

(57) ABSTRACT

A DC-DC converter system having at least one DC-DC converter operating in either a PWM mode or a PFM mode is provided. The DC-DC converter system includes a state machine configured to control the switching between the PWM mode and PFM mode. The state machine determines whether an inductor current provided by the DC-DC converter reaches a first specified value for a selective number of clock cycles so switching between the PWM mode and PFM mode is to occur. A pulse generator circuit is connected to the state machine and being configured to provide the appropriate switching period for the PWM mode and the PFM mode at the time of switching. The pulse generator circuit is shared amongst the PWM mode or PFM mode and utilizes a master clock for its operations.

17 Claims, 5 Drawing Sheets

DC-DC CONVERTERS WITH PULSE GENERATORS SHARED BETWEEN PWM AND PFM MODES

BACKGROUND OF THE INVENTION

The invention is related to the field of DC-DC converters, and in particular to DC-DC converters with pulse generators shared between PWM and PFM modes DC-DC converters are commonly used to supply DC power to electronic devices, such as personal computers, hand-held devices, and the like, and are available in a variety of configurations for deriving a desired DC output voltage from a given source of DC input voltage. For example, a buck mode or step-down DC-DC converter is often used to supply a regulated DC output voltage, whose value is less than the value of the DC source voltage. A typical step-down DC-DC converter includes one or more power switches, current flow paths through which are coupled between a DC input voltage terminal and a reference voltage terminal (e.g., ground), and the common or phase node between which is connected through an output inductor to an output voltage node, to which a storage capacitor and the powered load/device are connected. By controllably switching the power switches on and off, the upstream end of the output inductor is alternately connected between the DC input voltage and the reference voltage. This produces an alternately ramped-up and ramped-down output current through the output inductor to the output node, and causes a stepped-down DC output voltage to be delivered to the load. The DC-DC converter may be configured as a voltage mode converter or a current mode converter.

In addition to the above-described voltage mode and current mode DC-DC converters, there is an additional type of DC-DC converter, known as a constant on-time or pulse-frequency modulated (PFM) DC-DC converter. This type of converter is typically used in applications where load current demand is relatively small, as in the case of a "sleep" or "quiescent" mode of operation of a notebook computer, for example. A PFM converter includes a control loop having a voltage comparator, the output of which is used to create a triggering signal for a one-shot that sets a constant on-time for a relatively narrow pulse-width switching signal upon which switching times of the power switches are based. Because of its relatively narrow pulse-width, the switching signal provides the PFM mode converter with ability to turn on the power switches for very short time intervals—just sufficient to meet the very low current demands of the load, thereby saving power and prolonging battery life. This mode of operation is customarily referred to as discontinuous conduction mode (DCM), because for each switching pulse, the current delivered through the inductor is allowed to reach zero, and the power switches are opened when this happens.

SUMMARY OF THE INVENTION

According to one aspect of the invention, there is provided a DC-DC converter system having at least one DC-DC converter operating in either a PWM mode or a PFM mode. The DC-DC converter system includes a state machine configured to control the switching between the PWM mode and PFM mode. The state machine checks to see if an inductor current provided by the DC-DC converter reaches a first specified value for a selective number of clock cycles so switching between the PWM mode and PFM mode is to occur. A pulse generator circuit is connected to the state machine and being configured to provide the appropriate switching period for the PWM mode and the PFM mode at the time of switching. The pulse generator circuit is shared amongst the PWM mode or PFM mode and utilizes a master clock for its operations.

According to another aspect of the invention, there is provided a method of performing the operations of a DC-DC converter system having at least one DC-DC converter operating in either a PWM mode or a PFM mode. The method includes controlling the switching between the PWM mode and PFM mode. The controlling step includes checking to see if an inductor current provided by the DC-DC converter reaches a first specified value for a selective number of clock cycles so switching between the PWM mode and PFM mode is to occur. Also, the method includes providing a pulse generator circuit configured to provide the appropriate switching period for the PWM mode and the PFM mode at the time of switching. The pulse generator circuit is shared amongst the PWM mode or PFM mode and utilizes a master clock for its operations.

According to another aspect of the invention, there is provided a DC-DC converter system having at least one DC-DC converter operating in either a PWM mode or a PFM mode. The DC-DC converter system comprises a state machine configured to control the switching between the PWM mode and PFM mode. The state machine determines whether an inductor current provided by said DC-DC converter crosses a zero value in the PWM mode and checks for a selective number of clock cycles to detect if the current does not cross the zero value in the PFM mode, so switching between the PWM mode and PFM mode. The DC-DC converter system further comprises a pulse generator circuit connected to the state machine and being configured to provide the appropriate switching period for the PWM mode and the PFM mode at the time of switching.

DETAILED DESCRIPTION OF THE INVENTION

The invention provides a single pulse generator that is shared between the PFM and PWM modes. This allows for area savings and makes possible to enhance the way the system switches between the modes.

In DC-DC converters using switching inductive elements, it is typical to use two operation modes to maximize conversion efficiency depending on load-current conditions. The Pulse Width Modulation (PWM) mode is suitable for delivery of large currents, while the Pulse Frequency Modulation (PFM) mode is suitable for small load currents. In PWM, the switching period is fixed and the duty cycle is adjustable. In PFM, the pulse width is fixed and the period between pulses is adjustable. In the implementation of these modes, the circuits that define the duty cycle for PWM and the pulse width for PFM are usually independent. In the invention, these two variables are obtained from the same circuit.

Figure 1:
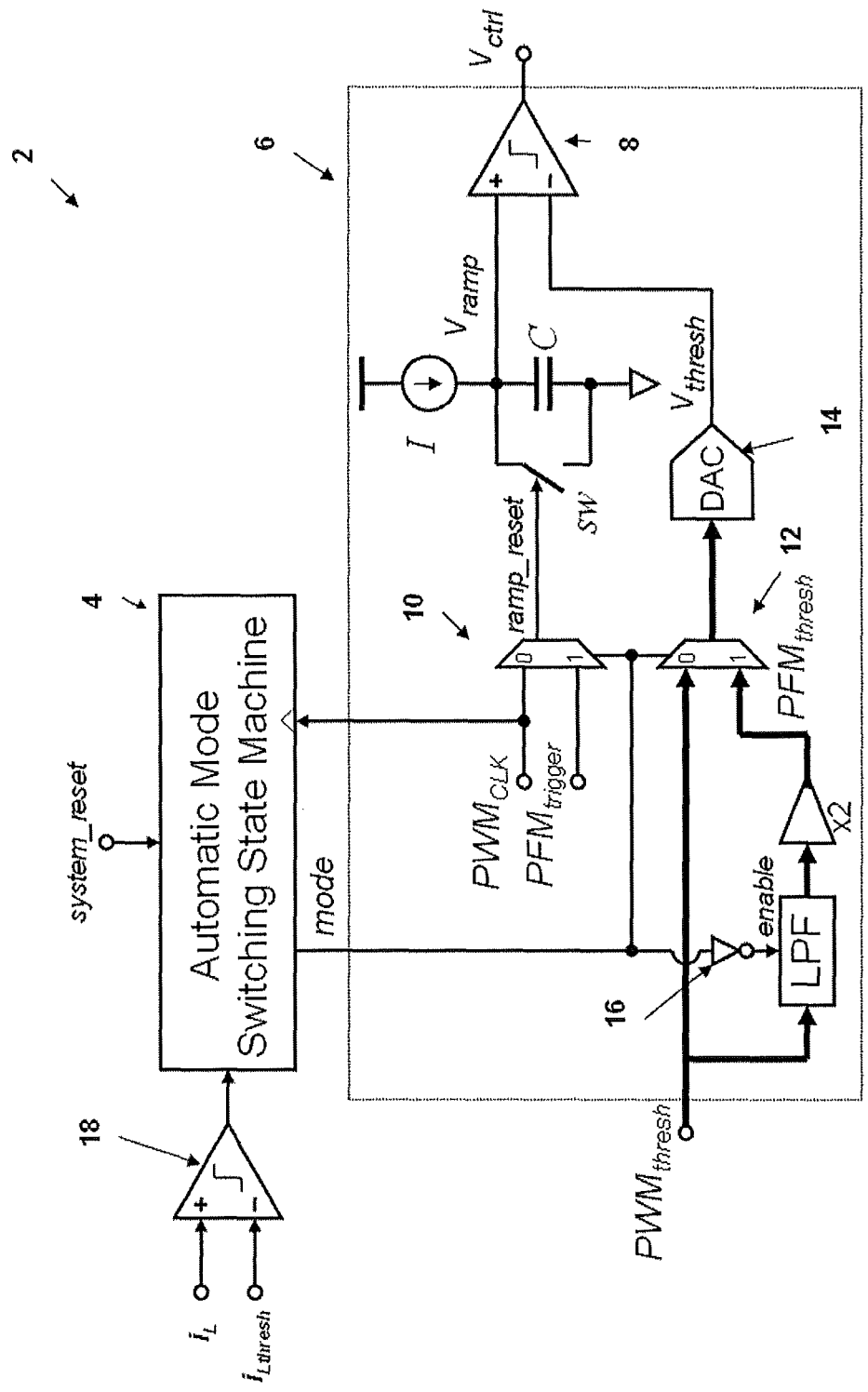
FIG. 1 is a schematic diagram illustrating a general depiction of the invention.

FIG. 1 is a schematic diagram illustrating a general depiction of the automated mode switch (AMS) for PFM and PWM modes. The AMS 2 includes an AMS state machine 4 being arranged to provide the controls for switching between PWM and PFM modes. The AMS state machine 4 is connected to a pulse generator circuit 6. The pulse generator circuit 6 is shared amongst the PWM and PFM modes (e.g. the AMS 2 uses the single pulse generator circuit 6 to serve both PWM and PFM modes). Moreover, AMS state machine 4 receives as input the load current $i_L$, a signal system_reset, and shares the clock signal $PWM_{CLK}$ with the pulse generator circuit 6. The state machine 4 uses the signal system_reset to reset its state variables and content during power up. In addition, the state machine 4 uses the load current $i_L$ to determine when switching occurs, this will be discussed further below. Also, the pulse generator circuit 6 receives input signals from a mixed-signal DC-DC buck converter that can operate in either PWM or PFM modes.

When switching to PFM mode, it is desirable that the ratio between the on-time and total switching period is similar to the duty-cycle in the PWM mode. This condition ensures a smooth transition, since it satisfies the balance in the inductor's volt-second and capacitor's charge achieved by the loop while in PWM mode. The pulse generator circuit 6 includes a first multiplexing element 12 that receives as input the signal $PWM_{thresh}$. Also, the input signal $PWM_{thresh}$ is provided to a low pass filter LPF that provides its output to the amplifier ×2. The output amplifier multiples by 2 its input to produce the output signal $PFM_{thresh}$. A mode signal is provided via a not gate 16 to the low pass filter LPF by the AMS state machine 4 to activate it when the PWM mode is present otherwise it is in a frozen state. The first multiplexing element 12 receives as input the mode signal and outputs either the signal $PWM_{thresh}$ or $PFM_{thresh}$ based on the mode signal. The mode signal identifies whether PFM mode or PWM mode is active. The digital analog converter (DAC) 14 receives the output signal of the first multiplexing element 12 and outputs a signal $v_{thresh}$ that is provided as input to a comparator 8.

A second multiplexing element 10 receives as input signals $PWM_{CLK}$ and $PFM_{TRIGGER}$. Also, the second multiplexing element 10 receives as input the mode signal provided by the AMS state machine 4 and outputs either the signal $PWM_{CLK}$ or $PFM_{TRIGGER}$ as the output signal ramp_reset based on the mode signal. Depending on the value provided by the signal ramp_reset, a NMOS switch sw either is open or closed. The NMOS switch sw is open and closed as to allow the charging and discharging of capacitor C to as to produce a ramp voltage $v_{ramp}$. The voltage $v_{ramp}$ is defined as the voltage across the capacitor C. Also, the voltage $v_{ramp}$ is provided as input to the comparator 8. The comparator 8 provides an output signal $v_{ctrl}$ used in switching between PWM and PFM modes.

In this arrangement, the PFM mode is synchronous to the clock, and can have a minimum switching period of two clock cycles. Therefore, to preserve the duty cycle, the on-time of the PFM pulse should be twice the duty cycle during PWM mode. This is accomplished by taking the digital average, using the low pass filter LPF, of the duty cycle, multiply it by two using the amplifier ×2, and use the result to define the on-time during PFM. During the PFM mode, the filtering circuit is put in a frozen state.

The pulse generation circuit 6 is configured in the analog domain that utilizes a master clock $PWM_{CLK}$ for all operations. The pulse generator circuit 6 is shared between the PWM and PFM modes. This allows for area savings and makes possible to enhance the way the system switches between the modes.

In the PWM mode, the voltage $v_{ramp}$ is reset every clock period, and the duty cycle is defined by comparing the voltage $v_{ramp}$ with a threshold voltage. During the PFM mode, the voltage $v_{ramp}$ is reset by a trigger signal $PFM_{TRIGGER}$ and the pulse width is defined by comparing the ramp voltage with a threshold voltage.

During the PWM mode, an AMS state machine 4 is used to monitor the load current $i_L$ using a polling method—it wakes up a current comparator 18 periodically (every $N_{POLL}$ clock cycles) and checks whether the load current $i_L$ has crossed zero for a single clock cycle. If this is the case, the state machine then checks for this condition every clock cycle. If verified for $N_{LOW}$ consecutive clock cycles, an assumption is made that the load current $i_L$ is too light, and the DC-DC converter is switched from PWM to PFM mode. If, at any time, the zero-crossing condition is not verified, the state machine will go back to the periodic polling mode. Note the comparator 18 compares the current value $i_{thresh}$, which in this case is zero, to that of the current load $i_L$.

During the PFM mode, the AMS state machine 4 monitors the current comparator 18 every time the output NMOS switch sw is on. Zero crossings mean that DC-DC converter should remain in PFM mode. If a zero crossing is not detected, the state machine checks the number of consecutive times that this condition happens. After a $N_{HIGH}$ number of times, it switches the DC-DC back to PWM mode.

Although the PFM mode operation is based on a synchronous state machine, one of its interface signals operates asynchronously: the zero-crossing current comparator 18 is active as long as the NMOS power switch is active, and if a zero-crossing condition is detected, the power switches are disabled promptly, without waiting for a clock edge. Allowing the NMOS device to be on any further would be wasteful in terms of power.

Figure 2:
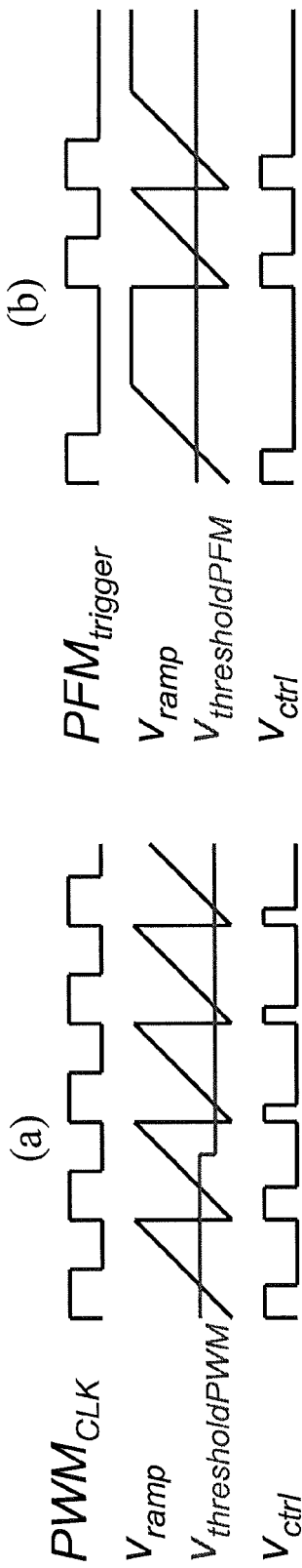
FIGS. 2A-2B are graphs illustrating waveforms during the PWM mode and the PFM mode.

An example of the waveforms generated for each of the modes is shown in FIGS. 2A-2B. In the PWM mode, the threshold voltage $PWM_{thresh}$ is typically generated by an error-amplifier and compensation circuit that determines the optimum duty cycle. In the PFM mode, the threshold voltage $PFM_{thresh}$ can be set to be a constant value, but it can be derived from the value used previously during the PWM mode.

Figure 3:
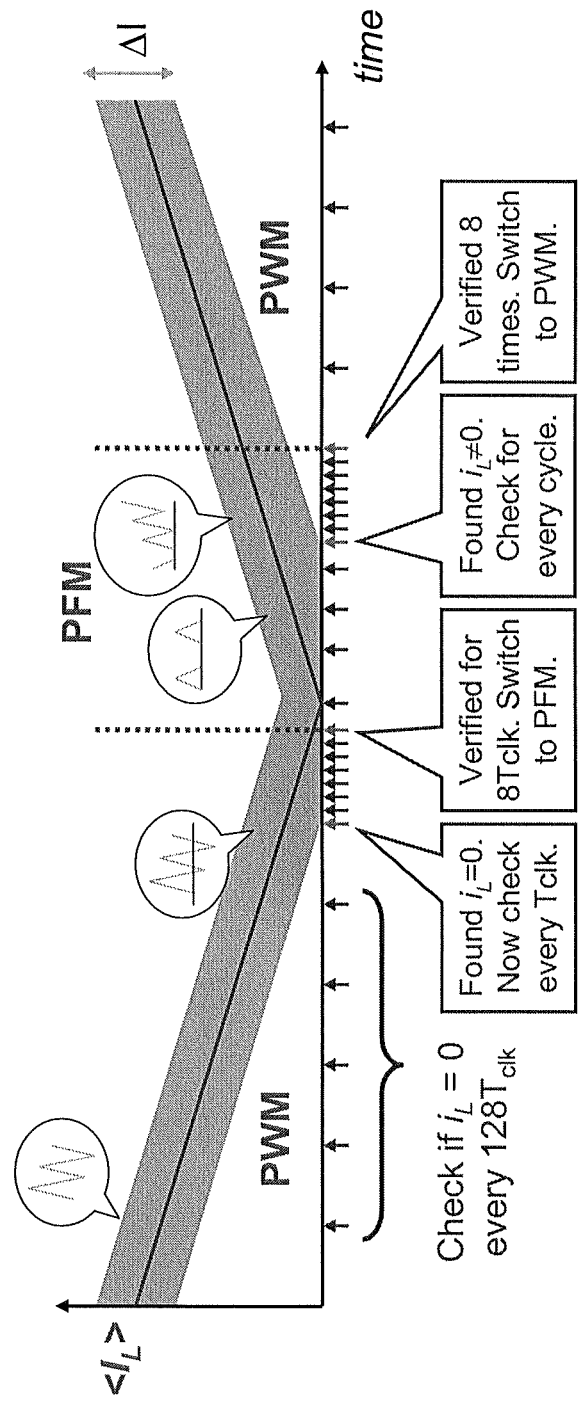
FIG. 3 is a graph illustrating features of the automatic mode switching (AMS)

An example of the mode switching approach in operation is shown in FIG. 3. In this case, the load current $i_L$ is ramped down slowly until it reaches zero, triggering the operation from PWM to PFM, and then ramps up, triggering the system back to PWM. For illustration purposes, $N_{POLL}$=128, $N_{LOW}$=8, and $N_{HIGH}$=8. Note that these values can be made programmable.

Figure 4:
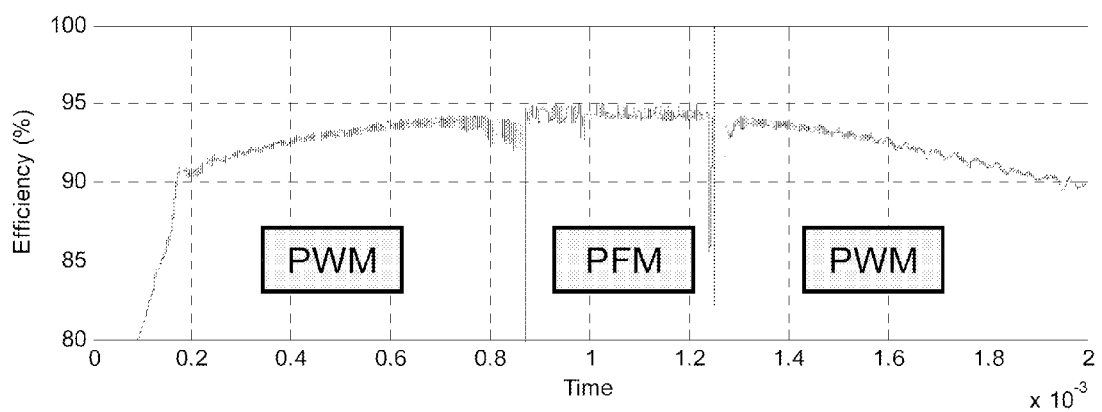
FIG. 4 is a graph illustrating the efficiency from a behavioral simulation of the AMS.

A behavioral simulation is also included here for validation of the described approach. The simulation uses the load current profile shown previously in FIG. 3. The behavioral model includes resistive and capacitive power losses from the switches and from the control loop. FIG. 4 shows the efficiency curve obtained from the simulation.

As the load current ramps down to zero during the PWM mode, the efficiency reaches a maximum and starts dropping around 0.8 ms. The converter operating mode gets automatically switched soon after that, and it can be observed how the efficiency improves once it is in PFM mode. As the load current increases, a slight drop in efficiency is again observed around 1.25 ms, and the converter is switched back to PWM mode. The time between 0 and 0.2 ms is not relevant to the analysis as the converter is powering up.

Figure 5:
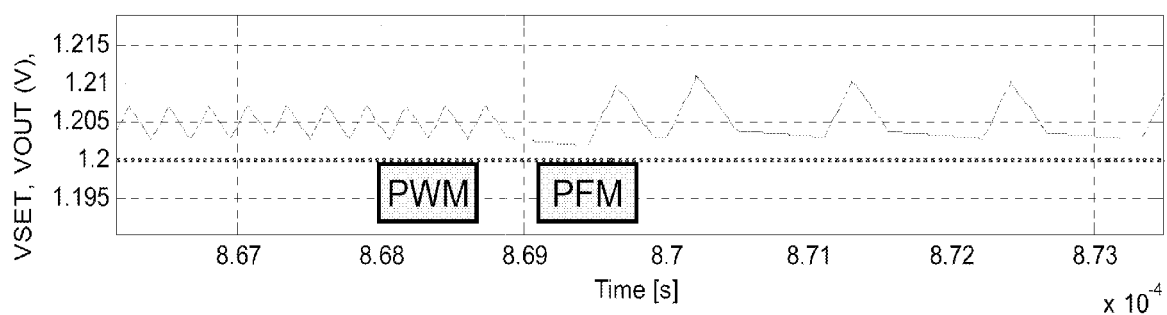
FIG. 5 is a graph illustrating the output voltage during the transition from the PWM mode to the PFM mode.

FIG. 5 shows the simulated output voltage during the transition from the PWM to PFM mode. As mentioned above, the converter uses two clock cycles during PFM at its fastest, and this is seen in the first PFM cycle. The output voltage shows only minor variations, as ensured by the pulse generation circuit 4 in FIG. 1.

The invention requires the PFM mode to run from a state machine which is clocked by the same clock signal used in the PWM mode. The switching frequency in the PFM mode is dependent on load current and battery voltage, and by running it synchronously, the switching frequency is effectively quantized. Although this can seem lower than optimal, the effect on power delivery efficiency is negligible, and it allows for a simplified handover between the modes and simpler implementation of features such as lock-out times and minimum switching rates.

The invention uses a larger polling period instead of monitoring the zero-current crossing comparator at every clock cycle. The invention provides a pulse generation circuit to provide the PFM on-time calculation needed for switching between the PWM and PFM modes. The invention eliminates the need for the on-time calculation to be based on a fixed preset, with no dependence on the PWM operation. Therefore, the invention takes into account the inductor and capacitor state variables that can have different balances during the PWM and PFM modes that cause voltage fluctuations during the transition. The pulse generator circuit permits PWM and PFM modes to share the same duty-cycle and on-time generator. Also, the pulse generator is configured to operate in analog with a single master clock for all operations.

Although the present invention has been shown and described with respect to several preferred embodiments thereof, various changes, omissions and additions to the form and detail thereof, may be made therein, without departing from the spirit and scope of the invention.

What is claimed is:

1. A DC-DC converter system having at least one DC-DC converter operating in either a PWM mode or a PFM mode, said DC-DC converter system comprising:
   a state machine configured to control the switching between the PWM mode and PFM mode, said state machine determining whether an inductor current provided by said DC-DC converter reaches a first specified value for a selective number of clock cycles so switching between the PWM mode and PFM mode is to occur; and
   a pulse generator circuit connected to said state machine, wherein the pulse generator circuit comprises a low pass filter and an amplifier arrangement for computing a pulse width of the PFM mode using a pulse width of the PWM mode as an input.

2. The DC-DC converter system of claim 1, wherein state machine polls a current comparator to check the inductor current.

3. The DC-DC converter system of claim 1, wherein said state machine determines when the first specified value crosses a zero value in the PWM mode and checks for said number of clock cycles if the first specified value is the same value to initiate switching to said PFM.

4. The DC-DC converter system of claim 1, wherein said state machine determines when the first specified value greater than zero in the PFM mode and checks for said number of clock cycles if the first specified value is the same value to initiate switching to said PWM.

5. The DC-DC converter system of claim 1, wherein said pulse generator circuit is configured to operate in the analog domain.

6. The DC-DC converter system of claim 1, wherein said pulse generator circuit and said state machine share a master clock.

7. The DC-DC converter system of claim 1, wherein said low pass filter receives a signal from said state machine defining the current mode of use.

8. A method of performing the operations of a DC-DC converter system having at least one DC-DC converter operating in either a PWM mode or a PFM mode, said method comprising:
   controlling the switching between the PWM mode and PFM mode by determining whether an inductor current provided by said DC-DC converter reaches a first specified value for a selective number of clock cycles so switching between the PWM mode and PFM mode is to occur; and
   providing a pulse generator circuit comprising a low pass filter and an amplifier arranged for computing a pulse width of the PFM mode using a pulse width of the PWM mode as an input.

9. The method of claim 8, wherein said controlling step comprises polling a current comparator to check the inductor current.

10. The method of claim 8, wherein said controlling step comprises determining when the first specified value crosses a zero value in the PWM mode and checking for said number of clock cycles if the first specified value is the same value to initiate switching to said PFM.

11. The method of claim 8, wherein said controlling step comprises determining when the first specified value greater than zero in the PFM mode and checking for said number of clock cycles if the first specified value is the same value to initiate switching to said PWM.

12. A DC-DC converter system having at least one DC-DC converter operating in either a PWM mode or a PFM mode, said DC-DC converter system, comprising:
   a state machine configured to control the switching between the PWM mode and PFM mode, said state machine determining whether an inductor current provided by said DC-DC converter crosses a zero value in the PWM mode and checking for a selective number of clock cycles to detect if the current does not cross the zero value in the PFM mode, so switching between the PWM mode and PFM mode; and
   a pulse generator circuit connected to said state machine, wherein the pulse generator circuit comprises a low pass filter and an amplifier arrangement for computing a pulse width of the PFM mode using a pulse width of the PWM mode as an input.

13. The DC-DC converter system of claim 1, wherein the pulse generator circuit is shared amongst the PWM mode and the PFM mode, and the pulse generator circuit is arranged to generate PWM pulses.

14. The method of claim 8, wherein the pulse generator circuit is shared amongst the PWM mode and the PFM mode, and the pulse generator circuit is arranged to generate PWM pulses.

15. The DC-DC converter system of claim 12, wherein the pulse generator circuit is shared amongst the PWM mode and the PFM mode, and the pulse generator circuit is arranged to generate PWM pulses.

16. A DC-DC converter system having at least one DC-DC converter operating in either a PWM mode or a PFM mode, said DC-DC converter system comprising:
   a state machine configured to control the switching between the PWM mode and PFM mode, said state machine determining whether an inductor current provided by said DC-DC converter reaches a first specified value for a selective number of clock cycles so switching between the PWM mode and PFM mode is to occur; and a pulse generator circuit connected to said state machine and being configured to utilize a pulse width of the PWM mode to determine a starting pulse width of the PFM mode;

wherein said starting pulse width of the PFM mode is defined to be twice the pulse width of the PWM mode for a same effective duty cycle.

17. A method of performing the operations of a DC-DC converter system having at least one DC-DC converter operating in either a PWM mode or a PFM mode, said method comprising:

controlling the switching between the PWM mode and PFM mode by determining whether an inductor current provided by said DC-DC converter reaches a first specified value for a selective number of clock cycles so switching between the PWM mode and PFM mode is to occur; and providing a pulse generator circuit configured to utilize a pulse width of the PWM mode to determine a starting pulse width of the PFM mode;

wherein said starting pulse width of the PFM mode is defined to be twice the pulse width of the PWM mode for a same effective duty cycle.

* * * * *